(12) United States Patent
Elger

(10) Patent No.: US 6,594,546 B2
(45) Date of Patent: Jul. 15, 2003

(54) PLANT FOR PROCESSING WAFERS

(75) Inventor: Jürgen Elger, Pyrbaum (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/134,125

(22) Filed: Apr. 29, 2002

(65) Prior Publication Data

US 2002/0159879 A1 Oct. 31, 2002

Related U.S. Application Data

(63) Continuation of application No. PCT/DE00/03742, filed on Oct. 24, 2000.

(30) Foreign Application Priority Data

Oct. 29, 1999 (DE) .......................................... 199 52 194

(51) Int. Cl.$^7$ ................................................. G06F 7/00
(52) U.S. Cl. ........................ 700/225; 700/213; 414/940
(58) Field of Search ................................. 700/213, 214, 700/218, 225, 226, 95, 108, 112, 115, 121; 414/940

(56) References Cited

U.S. PATENT DOCUMENTS

| 4,672,185 A | | 6/1987 | Sato et al. |
| 4,930,086 A | * | 5/1990 | Fukasawa ................... 700/116 |
| 5,266,812 A | | 11/1993 | Mokuo |
| 5,389,769 A | * | 2/1995 | Yamashita et al. .......... 235/375 |
| 5,474,647 A | | 12/1995 | Poultney et al. |
| 5,700,127 A | | 12/1997 | Harada et al. |
| 5,742,238 A | * | 4/1998 | Fox ........................ 340/825.49 |
| 6,151,533 A | * | 11/2000 | Iwasaki et al. ............. 700/214 |
| 6,418,352 B1 | * | 7/2002 | Ellis et al. ................... 700/116 |
| 6,440,178 B2 | * | 8/2002 | Berner et al. ............... 29/25.01 |

FOREIGN PATENT DOCUMENTS

| DE | 197 06 990 A1 | 4/1998 |
| DE | 197 45 386 A1 | 8/1998 |
| EP | 0 272 141 A2 | 6/1998 |
| JP | 06 286 824 | 11/1994 |
| JP | 10 321 694 A | 12/1998 |
| JP | 11-260 883 | 9/1999 |
| WO | WO 99/49500 | 9/1999 |

* cited by examiner

*Primary Examiner*—Khoi H. Tran
(74) *Attorney, Agent, or Firm*—Laurence A. Greenberg; Werner H. Stemer; Ralph E. Locher

(57) ABSTRACT

A plant for processing wafers, having a plurality of fabrication units, a plurality of measuring units, and a transport system for transporting the wafers. The fabrication units and the measuring units are each assigned a registration system. The feeding-in and discharge of the wafers to and from the respective fabrication unit or measuring unit can be registered in order to determine the wafer occupancy in the unit. Depending on this occupancy, a supply request or disposal request can be generated for the respective fabrication unit and measuring unit.

22 Claims, 3 Drawing Sheets

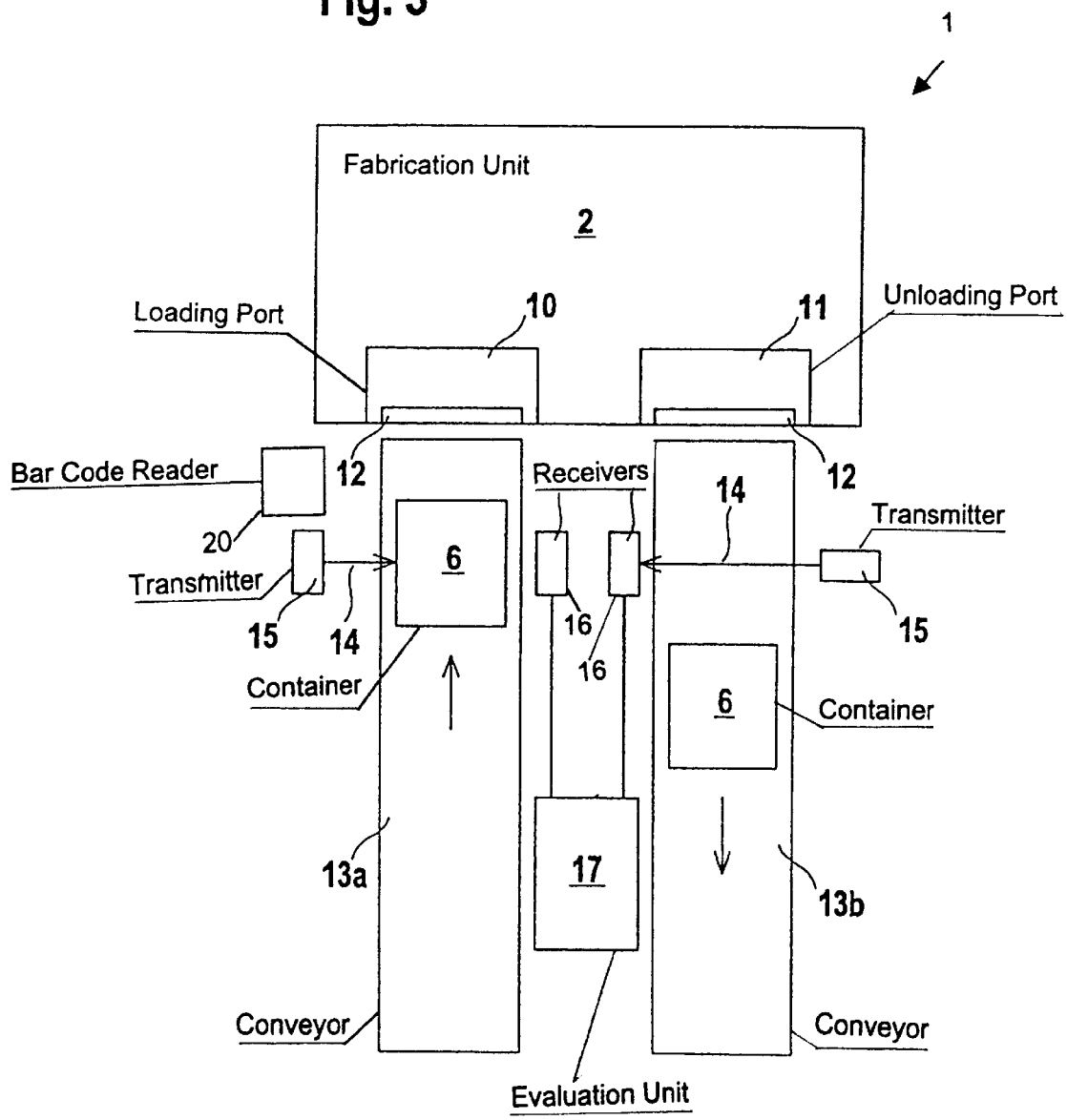

PLANT FOR PROCESSING WAFERS

CROSS-REFERENCE TO RELATED APPLICATION

This application is a continuation of copending International Application No. PCT/DE00/03742, filed Oct. 24, 2000, which designated the United States.

Background of the Invention

Field of the Invention

The invention relates to a plant for processing wafers in which wafers are transported between fabrication units and measuring units.

Plants of this type include a large number of fabrication units that can be used to carry out different fabrication processes. These fabrication processes are, in particular, etching processes, wet chemical processes, diffusion processes, and diverse cleaning processes such as the CMP (Chemical Mechanical Polishing) process. For each of these processes, one or more fabrication units is or are provided, in which various fabrication steps of a fabrication process are carried out.

In addition, such plants include a large number of measuring units. In the measuring units, the processing quality of one or more fabrication steps of a fabrication process is checked.

The entire fabrication process is subject to strict cleanliness requirements, and therefore, the fabrication units and the measuring units are arranged in a clean room or in a system of clean rooms.

The wafers are placed in containers designed as cassettes and are fed to the individual fabrication units in predetermined batch sizes using a transport system. In addition, the outward transport of the cassettes after the processing of these wafers is carried out using the transport system.

The transport system typically has a conveyor system having a number of conveyors which, for example, are designed in the form of roller conveyors. In this case, the cassettes with the wafers are transported resting on the roller conveyors. Alternatively, the conveyor system may also include continuous conveyors, suspension conveyors or the like.

In order to control plants of this type, a material disposition system is normally provided. By using this material disposition system, wafers in specific numbers are removed from a storage device or similar apparatus and are combined into batches. For the individual batches, working plans are formulated which contain the individual processing steps that are carried out with the wafers in the individual fabrication units and measuring units as they pass through the plant. In addition, the allocation of priorities for the individual wafers is carried out using the material disposition system. By using this established priority, the result is a specific processing sequence for the wafers of the different batches.

Finally, the wafers are fed by the material disposition system to the transport system, and the transport system feeds the containers with the wafers to the individual fabrication units and measuring units. Here, the containers in the transport system are loaded with predefined batch-related transport jobs. The transport jobs contain, in particular, the destinations for the individual containers. The destinations are the fabrication units and the measuring units.

On the basis of these transport jobs, the containers are fed to the individual destinations. Only in the event that a fabrication or measuring unit is out of operation will a fault message be output to the material disposition system, so that the further delivery of wafers is suppressed. However, the disadvantage here is that the transport jobs can still be given to individual fabrication and measuring units when, although the latter are still serviceable, they are already overloaded. In this case, the wafers back up in front of the relevant fabrication and measuring units. As a result of the waiting times which occur during the processing of the wafers in this case, their passage time through the plant is increased undesirably, as a result of which, in particular, the production costs for the wafers are also increased.

SUMMARY OF THE INVENTION

It is accordingly an object of the invention to provide a plant of the type mentioned at the beginning which overcomes the above-mentioned disadvantages of the prior art apparatus of this general type.

In particular, it is an object of the invention to provide a plant of the type mentioned at the beginning such that the passage times of the wafers during their processing in the plant are as low as possible.

With the foregoing and other objects in view there is provided, in accordance with the invention, a plant for processing wafers that includes a plurality of units. Each one of the plurality of the units includes either a fabrication unit or a measuring unit. The plant also includes a transport system for transporting the wafers. Each respective one of the plurality of the units includes a loading and unloading station having at least one loading port for feeding in the wafers, a processing flap for closing the loading port, at least one unloading port for discharging the wafers, and a processing flap for closing the unloading port. Each respective one of the plurality of the units includes a registration system configured for registering a feeding-in and a discharging of the wafers to and from the respective one of the plurality of the units in order to determine a wafer occupancy in the respective one of the plurality of the units. For each respective one of the plurality of the units, a selected request is generated as a function of the wafer occupancy in the respective one of the plurality of the units. The selected request is either a supply request for the respective one of the plurality of the units or a disposal request for the respective one of the plurality of the units. The registration system of each respective one of the plurality of the units has a sensor configuration for registering the number of the wafers that are fed-in to the respective one of the plurality of the units and that are discharged from the respective one of the plurality of the units. The sensor configuration of the registration system of each respective one of the plurality of the units enables the registration of an actuation of the processing flap for closing the loading port of the respective one of the plurality of the units. The sensor configuration of the registration system of each respective one of the plurality of the units also enables the registration of an actuation of the processing flap for closing the unloading port of the respective one of the plurality of the units.

According to the invention, the fabrication units and measuring units of the plant are each assigned a registration system, with which the feed and discharge of the wafers to and from the respective fabrication or measuring unit can be registered in order to determine their wafer occupancy. Depending on this occupancy, a supply or disposal request for the respective fabrication or measuring unit can be generated.

The registration system can therefore include, in particular, a sensor configuration that is used to count the wafers that are fed to a fabrication unit or measuring unit or discharged from the latter. At the same time, the individual wafers or the containers in which the wafers are transported can particularly advantageously be identified. Depending on the information registered in the registration system, supply and disposal requests for the individual fabrication and measuring units are preferably generated in a control station that is coupled to the individual fabrication and measuring units. Using the capacity utilizations of the individual fabrication and measuring units, known in the control station, the units are fed with wafers in suitable numbers via a suitable selection of transport jobs. Since the wafers can preferably be identified in the registration systems, the feed of the individual wafers in the fabrication units and measuring units is also carried out in an optimized manner with regard to the current processing states and in accordance with the processing steps that can be carried out in the fabrication and measuring units.

As a result, waiting times of the wafers in front of the individual fabrication and measuring units can largely be avoided, and the processing capacities of the fabrication and measuring units can be used optimally.

It is particularly advantageous that the registration systems can be designed as modules that can be retrofitted to existing fabrication and measuring units.

With the known fabrication and measuring units in use, the processing capacities available there cannot be registered. In addition, there are no interfaces via which such information could be output. In order to make such information available, it would be necessary for the fabrication and measuring unit to be reconceived in significant areas, which would lead to comprehensive design changes. This would not only give rise to considerable investment costs but would also be extremely time-consuming.

However, with the registration systems designed as modules, the functional scope of the fabrication and measuring units can be expanded quickly and without great financial expenditure.

Other features which are considered as characteristic for the invention are set forth in the appended claims.

Although the invention is illustrated and described herein as embodied in a plant for processing wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic representation of a registration system on a fabrication unit of the plant shown in FIG. 1.

DESCRIPTION OF THE PREFERRED EMBODIMENTS

Figure 1:
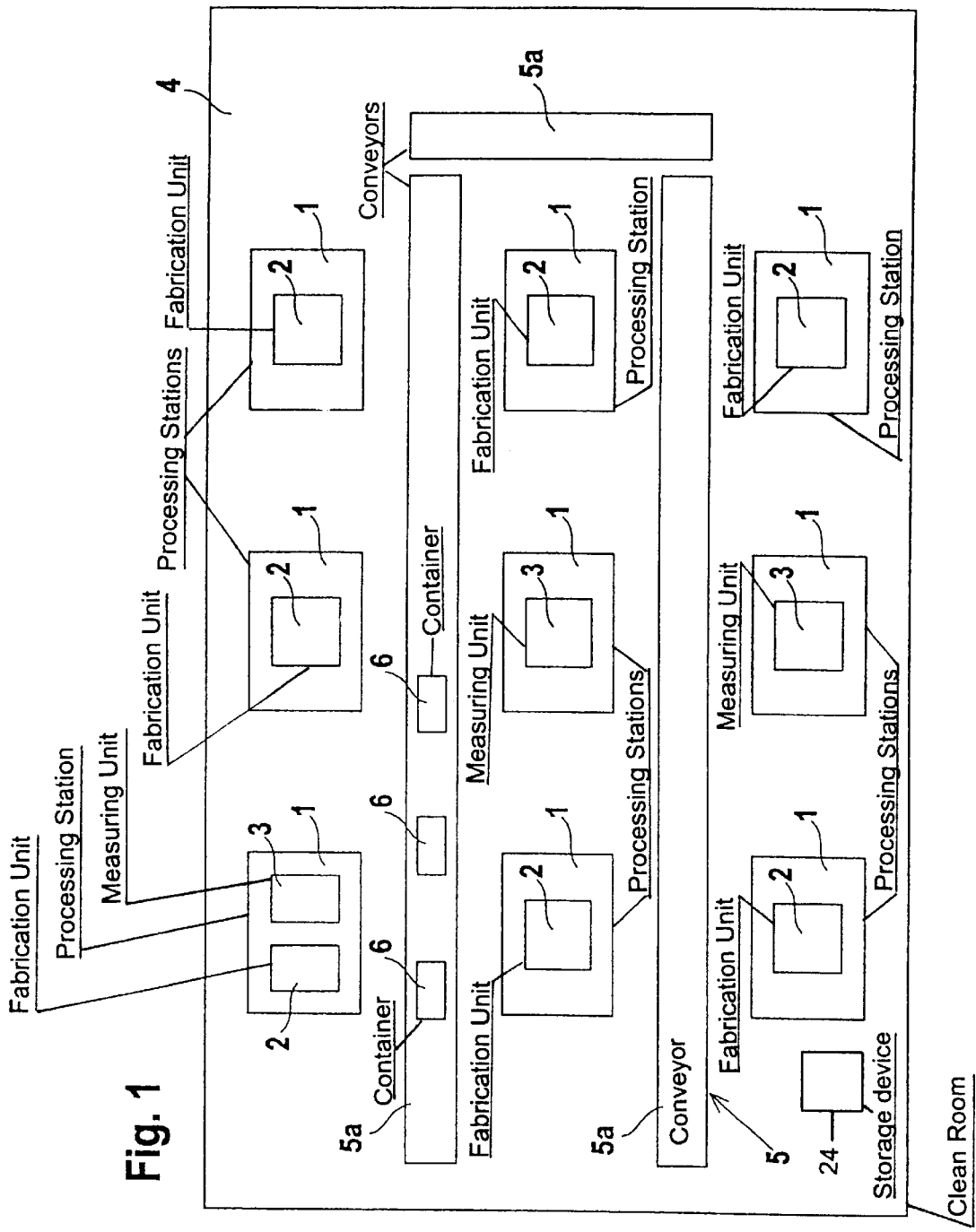
FIG. 1 is a schematic representation of a plant having a configuration of processing stations for processing wafers.

Referring now to the figures of the drawing in detail and first, particularly, to FIG. 1 thereof, there is schematically shown a plant for processing wafers. The plant has a large number of processing stations 1. One or more fabrication units 2 or measuring units 3 are provided in a processing station 1.

The fabrication units 2 are used to carry out different fabrication steps in the fabrication processes required to process the wafers. These fabrication processes include, in particular, etching processes, wet chemical processes, diffusion processes and cleaning processes. For the individual fabrication processes, one or more fabrication units 2 can be provided, corresponding to the number of fabrication steps to be carried out.

The measuring units 3 are used to check the processing quality of the fabrication steps carried out in the individual fabrication units 2.

The processing stations 1 with the individual fabrication units 2 and measuring units 3 are arranged in a clean room 4 and are connected to one another by a transport system. Alternatively, the processing stations 1 can be distributed over a system of clean rooms 4.

The transport system has a conveyor system 5 with a plurality of conveyors 5a, which feeds the wafers to the individual processing stations 1. Here, the wafers are transported in containers 6, which are preferably designed as cassettes. The conveyors 5a can be designed in the form of roller conveyors, continuous conveyors, or the like. Transfer stations or the like for transferring the wafers can be provided between the conveyors 5a. In addition, the transport system can have a storage system, which includes a plurality of storage devices 24 distributed in the clean room 4. These storage devices can be formed, in particular, as stockers. Containers 6 with wafers are temporarily stored in these storage devices. For example, containers 6 which contain wafers that have been processed incorrectly in the individual fabrication units 2 can be temporarily stored there. At suitable times, these incorrectly processed wafers are removed from the storage devices and are fed to specific fabrication units 2 to be reworked.

Figure 2:
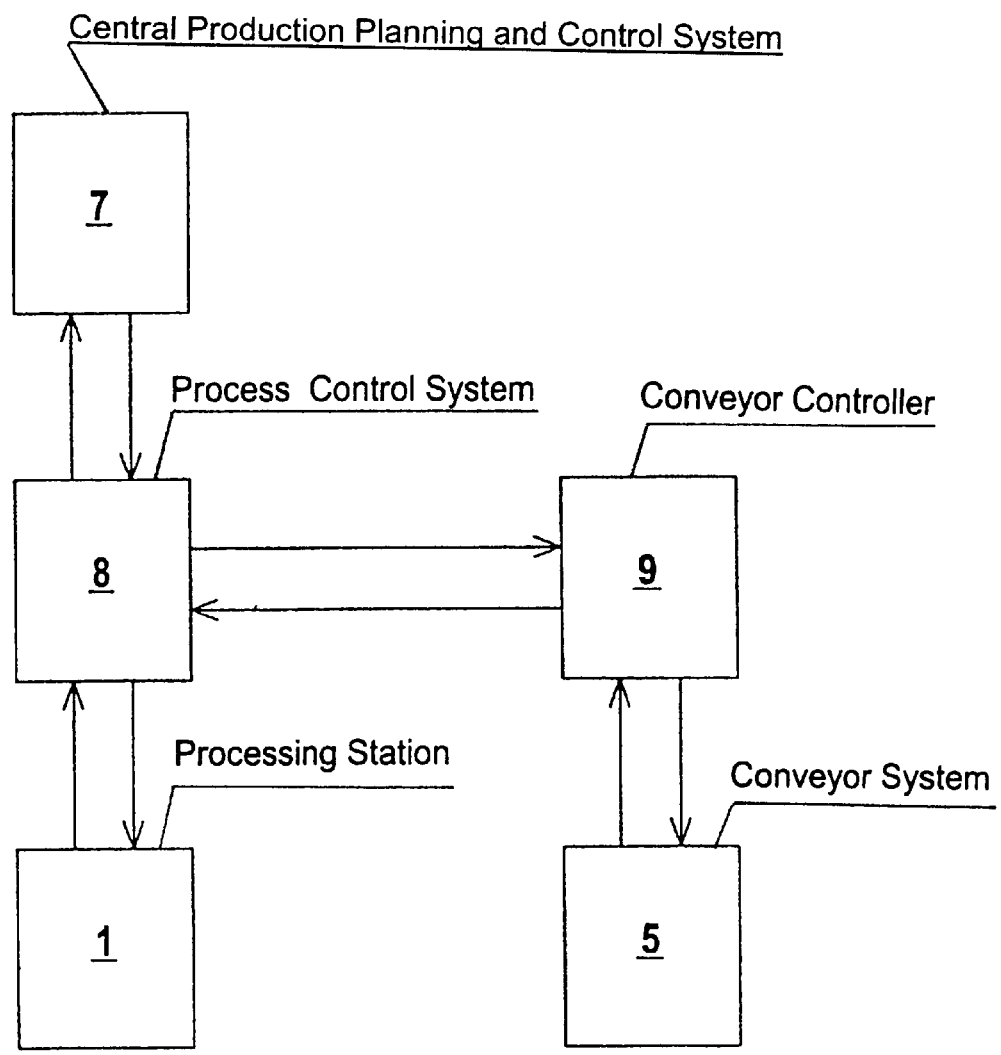
FIG. 2 is a block diagram of components relating to the sequence control of the plant shown in FIG. 1.

FIG. 2 shows a block diagram relating to the sequence control of the plant for processing wafers. A central production planning and control system 7 is connected to a process control system 8. The individual processing stations 1 with the fabrication units 2 and measuring units 3 are connected to the process control system 8. A conveyor controller 9 is additionally connected to the process control system 8. The conveyor controller 9 is connected to the conveyor system 5 of the transport system.

The aforementioned components of the plant each have at least one computer unit. The connections between the individual components are in each case designed as bidirectional data lines between the individual computer units of these components.

The production planning and control system 7 is used to determine the capacity and to determine the demand for the entire plant. The capacities and demands for processing the wafers in the individual fabrication units 2 and measuring units 3 are planned in advance for time periods of the order of magnitude of a few days to a few weeks. This planning is used to carry out an allocation of specific processing steps for fabrication units 2 and measuring units 3 which are particularly suitable for this purpose.

In addition, fabrication jobs and working plans for the processing of the wafers are generated in the production planning and control system 7.

In the process control system 8, at the start of the processing process, a plurality of wafers are combined into batches. The wafers of a batch are accommodated in a container 6. For this purpose, the appropriate wafers are removed from a storage device by the process control system 8 and are accommodated, manually or by machine, in containers 6.

From the production planning and control system 7, the individual working plans and fabrication jobs are read into the process control system 8, stored and managed. From the working plans and fabrication jobs, parameter sets for the definition of the processing steps which are to be carried out in the individual fabrication units 2 and measuring units 3 are generated by the process control system 8 and read into the units. Finally, a check is made in the process control system 8 as to whether the respective next processing step for the individual wafers can be carried out in the fabrication unit 2 and measuring unit 3 envisaged for this purpose.

In addition, by using the data in the process control system 8, prioritisation for the processing of the individual wafers or batches is carried out. This planning typically varies within a time horizon of a few minutes to a few hours. The prioritisation of the wafers is in this case dependent, in particular, on their processing states.

The conveyor system 5 of the plant is controlled by the conveyor controller 9 in accordance with the predefinitions of the process control system 8. For this purpose, the conveyor controller 9 has a number of motors and transmitters for controlling the drive elements of the conveyor system 5.

According to the invention, the fabrication units 2 and measuring units 3 are each assigned a registration system by means of which the feed and discharge of the wafers to and from the respective fabrication unit 2 or measuring unit 3 can be registered. From this data, the occupancies of the individual fabrication units 2 and measuring units 3 with wafers are determined. In the process control system 8, to which the fabrication units 2 and measuring units 3 are connected, the occupancies of these units are used to generate supply and disposal requests. The process control system 8 uses these supply and disposal requests to load transport jobs into the transport system in order to feed the wafers in suitable numbers to the fabrication units 2 and measuring units 3 in accordance with these requests, or to transport the wafers away.

In addition, in principle, such registration systems can also be assigned to the storage devices of the storage system.

In the present exemplary embodiment, the registration systems include modules that can be fitted to the fabrication units 2 and measuring units 3 without necessitating a change to the functional scope of these units 2, 3. The modules can therefore be retrofitted to the existing fabrication units 2 and measuring units 3 in a straightforward manner.

One example of such a registration system is illustrated in FIG. 3. FIG. 3 shows a processing station 1 with a fabrication unit 2. The feed and discharge of wafers is carried out via a loading and unloading station. The latter has a loading port 10 to feed wafers to the fabrication unit 2 and an unloading port 11 to transport the wafers away. The loading port 10 and the unloading port 11 each have a processing flap 12. By opening the processing flaps 12, the containers 6 with wafers are fed into the fabrication unit 2 via the opening of the loading port 10 and are removed from the fabrication unit 2 via the opening of the unloading port 11.

In addition, the loading and unloading stations have two conveyors 13a, 13b. Via the first conveyor 13a, the containers 6 with wafers are fed to the loading port 10. By using the conveyor 13b, the containers 6 removed at the unloading port 11 are transported away.

The registration system has a sensor arrangement for registering the number of wafers that are fed via the loading and unloading stations. In the exemplary embodiment illustrated in FIG. 3, the sensor arrangement is designed as a light barrier. The sensor arrangement includes optical sensors.

Each sensor arrangement or light barrier has a transmitter 15 emitting transmitted light beams 14 and a receiver 16 receiving the transmitted light beams 14. The detection of objects is carried out as a result of the interruption of the beam path of the transmitted light beams 14.

By using the light beams, the containers 6 moved via the loading and unloading stations are registered. For this purpose, the light barriers are connected to an evaluation unit 17, for example a microcontroller, which counts the number of interruptions of the beam path of the transmitted light beams 14.

In principle, the containers 6 can also be counted by using the light barriers to continuously register the opening and closing of the processing flaps 12.

In the present exemplary embodiment, in each case one light barrier is fitted to one of the conveyors 13a, 13b of the loading and unloading station, so that the containers 6 transported on the conveyors 13a, 13b are counted separately by the light barriers.

The light barrier signals are counted by the evaluation unit 17. The counting pulses can then be evaluated in the process control system 8 in order to determine the occupancy state, i.e., the number of wafers occupied in the fabrication unit 2. The occupancy state can then be used to generate the supply and disposal requests.

Alternatively, the occupancy of the fabrication unit 2 can be determined in the evaluation unit and then read into the process control system 8.

In principle, the registration system can be designed without a sensor arrangement. For example, in order to count the incoming and outgoing containers 6 in the fabrication unit 2 by tapping off suitable digital signals at the fabrication unit 2, the actuation of the processing flaps 12 on the loading port 10 and unloading port 11 can be registered.

Alternatively, the registration system for counting the containers 6 can also have an actuator arrangement. The actuators can be formed, for example, by mechanical switches or the like.

In principle, the aforementioned actuator or sensor arrangements can also be used for the purpose of counting individual wafers that are fed to the fabrication units 2 and measuring units 3 and that are transported away from the latter.

In a particularly advantageous embodiment, the registration systems each also have a device for identifying the wafers or the containers 6 in which the wafers are transported. For this purpose, the wafers and/or containers 6 are in each case expediently identified by bar codes.

The wafers and/or the containers 6 are then identified using bar-code readers 20, which are preferably arranged on the loading and unloading stations of the fabrication units 2 and measuring units 3.

These bar-code readers 20 advantageously form not only the device for identifying the wafers and/or containers 6, but at the same time, also form the sensor arrangements that register the number of wafers and/or containers 6 going to and from the respective fabrication unit 2 or measuring unit 3.

In this case, not only can the number of incoming wafers and the number of outgoing wafers at a fabrication unit 2 and measuring unit 3 be reported to the process control system 8 by the registration systems, but it is also possible to register which wafers are located at which processing stage at a specific fabrication unit 2 and measuring unit 3.

By using this information, in the process control system 8 the supply and disposal requests can be tailored exactly to the respective processing states of the wafers.

The fabrication units 2 and measuring units 3 of the plant in each case typically have a predefined number of chambers. Using the registration system, the allocation of the wafers to the individual chambers is expediently registered. In this case, identification of the wafers using the registration system is particularly expedient. The supply and disposal requests are then generated in the process control system 8 for the individual chambers of the fabrication units 2 and measuring units 3.

I claim:

1. A plant for processing wafers, comprising:
   a plurality of units, each one of said plurality of said units including a device selected from the group consisting of a fabrication unit and a measuring unit; and
   a transport system for transporting the wafers;
   each respective one of said plurality of said units including a loading and unloading station having at least one loading port for feeding in the wafers, a processing flap for closing said loading port, at least one unloading port for discharging the wafers, and a processing flap for closing said unloading port;
   each respective one of said plurality of said units including a registration system configured for registering a feeding-in and a discharging of the wafers to and from said respective one of said plurality of said units in order to determine a wafer occupancy in said respective one of said plurality of said units;
   for each respective one of said plurality of said units, a selected request being generated as a function of the wafer occupancy in said respective one of said plurality of said units, the selected request being selected from the group consisting of a supply request for said respective one of said plurality of said units and a disposal request for said respective one of said plurality of said units;
   said registration system of each respective one of said plurality of said units having a sensor configuration for registering a number of the wafers that are fed-in to said respective one of said plurality of said units and that are discharged from said respective one of said plurality of said units;
   said sensor configuration of said registration system of each respective one of said plurality of said units enabling registration of an actuation of said processing flap for closing said loading port of said respective one of said plurality of said units; and
   said sensor configuration of said registration system of each respective one of said plurality of said units enabling registration of an actuation of said processing flap for closing said unloading port of said respective one of said plurality of said units.

2. The plant according to claim 1, comprising:
   containers containing the wafers;
   said containers for feeding the wafers to said plurality of said units; and
   said containers for discharging the wafers from said plurality of said units.

3. The plant according to claim 1, comprising:
   individual conveyors for transporting the wafers to and from said loading port and said unloading port of said loading and unloading station of each respective one of said plurality of said units.

4. The plant according to claim 3, wherein said sensor configuration of said registration system of each respective one of said plurality of said units enables registration of the wafers on said conveyors.

5. The plant according to claim 1, wherein said sensor configuration has a plurality of optical sensors.

6. The plant according to claim 5, wherein said optical sensors include devices selected from the group consisting of light barriers, light sensors, and bar-code readers.

7. The plant according to claim 1, wherein:
   said registration system of each respective one of said plurality of said units receives digital signals from said respective one of said plurality of said units indicating:
      the actuation of said processing flap for closing said loading port of said respective one of said plurality of said units, and
      the actuation of said processing flap for closing said unloading port of said respective one of said plurality of said units.

8. The plant according to claim 1, wherein:
   said registration system of each respective one of said plurality of said units has an actuator configuration for registering the number of wafers that are fed to said respective one of said plurality of said units and that are discharged from said respective one of said plurality of said units.

9. The plant according to claim 8, wherein said actuator configuration includes mechanical switches.

10. The plant according to claim 1, comprising:
    a process control system for generating the selected request for each respective one of said plurality of said units;
    said process control system connected to said registration system of each respective one of said plurality of said units.

11. The plant according to claim 10, wherein:
    said process control system receives a first number, from said registration system of each respective one of said plurality of said units, indicating the wafers being fed-in to said respective one of said plurality of said units;
    said process control system receives a second number, from said registration system of each respective one of said plurality of said units, indicating the wafers being discharged from said respective one of said plurality of said units; and
    said process control system uses the first number and the second number to determine the wafer occupancy in said respective one of said plurality of said units.

12. The plant according to claim 10, wherein:
    said registration system of each respective one of said plurality of said units includes an evaluation unit;
    said evaluation unit using a number indicating the wafers being fed-in to said respective one of said plurality of said units and a number indicating the wafers being discharged from said respective one of said plurality of said units to determine the wafer occupancy in said respective one of said plurality of said units; and
    said process control system receiving the wafer occupancy in said respective one of said plurality of said.

13. The plant according to claim 1, wherein said registration system of each respective one of said plurality of said units includes a device for identifying the wafers.

14. The plant according to claim 13, wherein:

said device for identifying the wafers is a bar-code reader for identifying the wafers.

15. The plant according to claim 13, wherein:

each respective one of said plurality of said units is formed with a plurality of chambers;

said registration system of each respective one of said plurality of said units is configured for registering which ones of the wafers and how many of the wafers are allocated to individual ones of said plurality of said chambers.

16. The plant according to claim 15, comprising:

a process control system for generating the selected request for each respective one of said plurality of said units.

17. The plant according to claim 13, comprising:

a process control system for generating the selected request for each respective one of said plurality of said units;

containers containing the wafers being transported by said transport system; and said process control system checking whether an immediately subsequent processing step for the wafers in one of said containers can be carried out in one of said plurality of said units.

18. The plant according to claim 13, comprising:

a process control system for generating the selected request for each respective one of said plurality of said units;

said process control system providing parameter sets to said plurality of said units; and the parameter sets defining processing steps being carried out with the wafers of a specific batch.

19. The plant according to claim 1, comprising:

a storage system having a plurality of storage devices including registration systems for registering a wafer occupancy in said plurality of said storage devices.

20. The plant according to claim 1, wherein said registration system of each respective one of said plurality of said units is a module that can be retrofitted to said respective one of said plurality of said units.

21. The plant according to claim 1, comprising:

individual conveyors for transporting the wafers to and from said loading port and said unloading port of said plurality of said loading and unloading stations;

containers containing the wafers;

said containers for feeding the wafers to said plurality of said fabrication units and to said plurality of said measuring units;

said containers for discharging the wafers from said plurality of said fabrication units and from said plurality of said measuring units;

said sensor configuration enables registration of the wafers in said containers on said conveyors.

22. The plant according to claim 1, comprising:

containers for carrying the wafers;

said containers having bar codes; and said registration system of each respective one of said plurality of said units including a bar code reader for identifying said containers carrying the wafers.

* * * * *